(12) United States Patent
Bhatia et al.

(10) Patent No.: US 11,106,366 B1
(45) Date of Patent: Aug. 31, 2021

(54) MAINTAINING CONSISTENT WRITE LATENCIES IN NON-VOLATILE MEMORY DEVICES

(71) Applicant: SK hynix Inc., Icheon-si (KR)

(72) Inventors: Aman Bhatia, Los Gatos, CA (US); Fan Zhang, Fremont, CA (US)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/868,367

(22) Filed: May 6, 2020

(51) Int. Cl.
*G06F 3/06* (2006.01)
*G11C 16/34* (2006.01)
*G11C 16/04* (2006.01)
*G11C 16/10* (2006.01)

(52) U.S. Cl.
CPC .......... *G06F 3/0611* (2013.01); *G06F 3/0659* (2013.01); *G06F 3/0679* (2013.01); *G11C 16/0483* (2013.01); *G11C 16/10* (2013.01); *G11C 16/3495* (2013.01)

(58) Field of Classification Search
CPC .. G06F 3/0604; G06F 3/0679; G06F 12/0857; G06F 13/1689; G06F 13/36; G06F 1/12; G06F 1/3225; G06F 1/3237; G06F 1/324; G06F 2201/88; G06F 3/0625; G06F 3/0629; G06F 3/0673; G06F 9/3836; G06F 3/0619; G06F 3/0659; G11C 11/4076; G11C 11/4096; G11C 2207/2254; G11C 7/04; G11C 7/10; G11C 7/1051; G11C 7/1066; G11C 7/1072; G11C 7/1078; G11C 7/109; G11C 7/1093; G11C 7/22; G11C 7/222; G11C 7/225; G11C 29/52; G11C 16/10; G11C 16/16
USPC ............ 365/233.11, 233.1, 185.23, 189.011, 365/189.09, 189.11, 189.17, 191, 203, 365/204, 210.12, 227, 229, 230.03; 710/61, 103
See application file for complete search history.

(56) References Cited

U.S. PATENT DOCUMENTS

2020/0218652 A1* 7/2020 Huang ................ G06F 12/0253

* cited by examiner

*Primary Examiner* — Thong Q Le
(74) *Attorney, Agent, or Firm* — Perkins Coie LLP

(57) ABSTRACT

Devices, systems and methods for maintaining consistent write latencies in non-volatile memory devices are described. An example method includes receiving, from a host device, a write command, computing an actual latency of the write command based on an arrival of the write command and a completion of the write command, incrementing, based on the actual latency, one or more of a plurality of counters, updating, based on the plurality of counters subsequent to the incrementing, a value of a minimum duration, and transmitting, at a time instance determined based on an updated value of the minimum duration, an indication of the completion of the write command to the host device, wherein the minimum duration represents a minimum latency between the arrival and the transmitting, and wherein transmitting at the time instance enables an observed latency to remain within a predetermined tolerance of an average value of the actual latency.

20 Claims, 12 Drawing Sheets

| # | Category | Col A | Col B | Col C | Col D | Col E | Col F | Comments |
|---|---|---|---|---|---|---|---|---|
| 1 | Violation 1 | - | >= 16 | > 7 | - | +2 | Y | 0 |
| 2 | Violation 2 | - | >= 1M | - | > 0 | +1 | Y | 0 |
| 3 | Violation 3 | - | >= 1K | - | > 15 | +4 | Y | 0 |
| 4 | Violation 4 | - | >= 1K | - | > 1 | +2 | Y | 0 |
| 5 | Violation 5 | - | >= 1K | > 1 | - | +2 | Y | 0 |
| 6 | Recovery 6 | 5 | >= 64K | = 0 | = 0 | -1 | Y | 5 | Do not go below LastSteadyMinDuration |
| 7 | Recovery 5 | 4 | >= 32K | = 0 | = 0 | -1 | N | 5 | " |
| 8 | Recovery 4 | 3 | >= 16K | = 0 | = 0 | -1 | N | 4 | " |
| 9 | Recovery 3 | 2 | >= 8K | = 0 | = 0 | -1 | N | 3 | " |
| 10 | Recovery 2 | 1 | >= 4K | = 0 | = 0 | -1 | N | 2 | " |
| 11 | Recovery 1 | 0 | >= 2K | = 0 | = 0 | -1 | N | 1 | " |
| 12 | Optimization | - | >= 8M | = 0 | = 0 | -1 | Y | 6 |
| 13 | Milestone | - | >= 2M | = 0 | = 0 | 0 | N | 7 | Record MinDuration as LastSteadyMinDuration |

*FIG. 7B*

MAINTAINING CONSISTENT WRITE LATENCIES IN NON-VOLATILE MEMORY DEVICES

TECHNICAL FIELD

This patent document generally relates to memory devices, and more specifically, to improving the performance of the memory devices.

BACKGROUND

Solid-state drives (SSDs) use multi-level NAND flash devices for persistent storage. However, multi-level NAND flash devices typically need to be erased before new data can be rewritten, which can result in large latencies. There is a demand for consistent write command latencies for both personal and enterprise applications.

SUMMARY

Embodiments of the disclosed technology relate to maintaining consistent write latencies in non-volatile memory devices. These and other features and benefits are achieved at least in-part by measuring the latency of each host-write command and tracking a minimum duration value, which is updated based on counters that track latency violations.

In an example aspect, a method for maintaining consistent write latencies in non-volatile memory devices is described. The method includes receiving, from a host device, a write command, computing an actual latency of the write command based on an arrival of the write command and a completion of the write command, incrementing, based on the actual latency, one or more of a plurality of counters, updating, based on the plurality of counters subsequent to the incrementing, a value of a minimum duration, and transmitting, at a time instance determined based on an updated value of the minimum duration, an indication of the completion of the write command to the host device, wherein the minimum duration represents a minimum latency between the arrival of the write command and the transmitting of the indication to the host device, wherein transmitting at the time instance enables an observed latency to remain within a predetermined tolerance of an average value of the actual latency, wherein the observed latency is determined based on a difference in time between the arrival of the write command and the transmitting, wherein a first counter of the plurality of counters indicates a total number of write commands, and is incremented upon a reception of the write command, and wherein each of a second and subsequent counter corresponds to a type of latency violation, and is incremented upon a determination that the latency exceeds a corresponding threshold of a plurality of thresholds.

In yet another example aspect, the above-described method may be implemented by a video encoder apparatus or a video decoder apparatus that comprises a processor.

In yet another example aspect, these methods may be embodied in the form of processor-executable instructions and stored on a computer-readable program medium.

The subject matter described in this patent document can be implemented in specific ways that provide one or more of the following features.

BRIEF DESCRIPTION OF THE DRAWINGS

FIG. 7B is a table with example thresholds corresponding to the FSM in FIG. 7A.

DETAILED DESCRIPTION

Solid state drives (SSDs) use NAND flash as storage media due to its excellent read latency compared to magnetic media based hard disk drives. However, NAND flash based media suffers from the requirement to erase a large block before its pages can be rewritten. This causes SSDs to periodically garbage-collect old blocks with many invalid pages to make room for new host-writes. Moreover, high-density NAND flash wherein each cell stores multiple levels, such as triple-level cell (TLC) flash with 8 levels and quad-level cell (QLC) flash with 16 levels, has a high programming time.

FIGS. 1-6 overview a non-volatile memory system (e.g., a flash-based memory, NAND flash) in which embodiments of the disclosed technology may be implemented.

Figure 1:
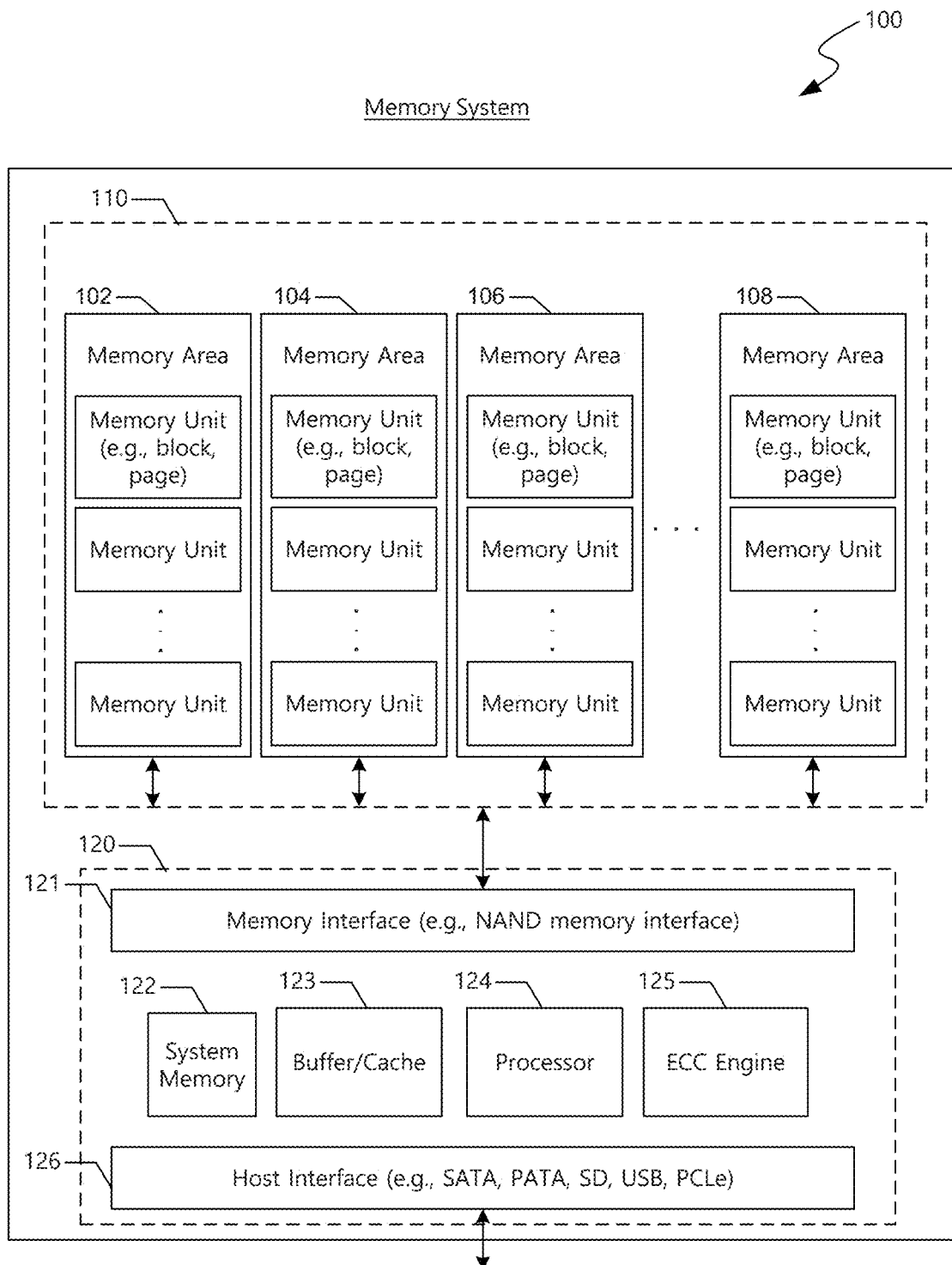
FIG. 1 illustrates an example of a memory system.

FIG. 1 is a block diagram of an example of a memory system 100 implemented based on some embodiments of the disclosed technology. The memory system 100 includes a memory module 110 that can be used to store information for use by other electronic devices or systems. The memory system 100 can be incorporated (e.g., located on a circuit board) in other electronic devices and systems. Alternatively, the memory system 100 can be implemented as an external storage device such as a USB flash drive and a solid-state drive (SSD).

The memory module 110 included in the memory system 100 can include memory areas (e.g., memory arrays) 102, 104, 106, and 108. Each of the memory areas 102, 104, 106, and 108 can be included in a single memory die or in multiple memory dice. The memory die can be included in an integrated circuit (IC) chip.

Each of the memory areas 102, 104, 106, and 108 includes a plurality of memory cells. Read, program, or erase operations can be performed on a memory unit basis. Thus, each memory unit can include a predetermined number of memory cells. The memory cells in a memory area 102, 104, 106, or 108 can be included in a single memory die or in multiple memory dice.

The memory cells in each of memory areas 102, 104, 106, and 108 can be arranged in rows and columns in the memory units. Each of the memory units can be a physical unit. For example, a group of a plurality of memory cells can form a memory unit. Each of the memory units can also be a logical unit. For example, the memory unit can be a block or a page that can be identified by a unique address such as a block address or a page address, respectively. For another example, wherein the memory areas 102, 104, 106, and 108 can include computer memories that include memory banks as a logical unit of data storage, the memory unit can be a bank that can be identified by a bank address. During a read or write operation, the unique address associated with a particular memory unit can be used to access that particular memory unit. Based on the unique address, information can be written to or retrieved from one or more memory cells in that particular memory unit.

The memory cells in the memory areas 102, 104, 106, and 108 can include non-volatile memory cells. Examples of non-volatile memory cells include flash memory cells, phase change random-access memory (PRAM) cells, magnetoresistive random-access memory (MRAM) cells, or other types of non-volatile memory cells. In an example implementation where the memory cells are configured as NAND flash memory cells, the read or write operation can be performed on a page basis. However, an erase operation in a NAND flash memory is performed on a block basis.

Each of the non-volatile memory cells can be configured as a single-level cell (SLC) or multiple-level memory cell. A single-level cell can store one bit of information per cell. A multiple-level memory cell can store more than one bit of information per cell. For example, each of the memory cells in the memory areas 102, 104, 106, and 108 can be configured as a multi-level cell (MLC) to store two bits of information per cell, a triple-level cell (TLC) to store three bits of information per cell, or a quad-level cells (QLC) to store four bits of information per cell. In another example, each of the memory cells in memory area 102, 104, 106 and 108 can be configured to store at least one bit of information (e.g., one bit of information or multiple bits of information), and each of the memory cells in memory area 102, 104, 106 and 108 can be configured to store more than one bit of information.

As shown in FIG. 1, the memory system 100 includes a controller module 120. The controller module 120 includes a memory interface 121 to communicate with the memory module 110, a host interface 126 to communicate with a host (not shown), a processor 124 to execute firmware-level code, and caches and memories 123 and 122, respectively to temporarily or persistently store executable firmware/instructions and associated information. In some implementations, the controller unit 120 can include an error correction engine 125 to perform error correction operation on information stored in the memory module 110. Error correction engine 125 can be configured to detect/correct single bit error or multiple bit errors. In another implementation, error correction engine 125 can be located in the memory module 110.

The host can be a device or a system that includes one or more processors that operate to retrieve data from the memory system 100 or store or write data into the memory system 100. In some implementations, examples of the host can include a personal computer (PC), a portable digital device, a digital camera, a digital multimedia player, a television, and a wireless communication device.

In some implementations, the controller module 120 can also include a host interface 126 to communicate with the host. Host interface 126 can include components that comply with at least one of host interface specifications, including but not limited to, Serial Advanced Technology Attachment (SATA), Serial Attached Small Computer System Interface (SAS) specification, Peripheral Component Interconnect Express (PCIe).

Figure 2:
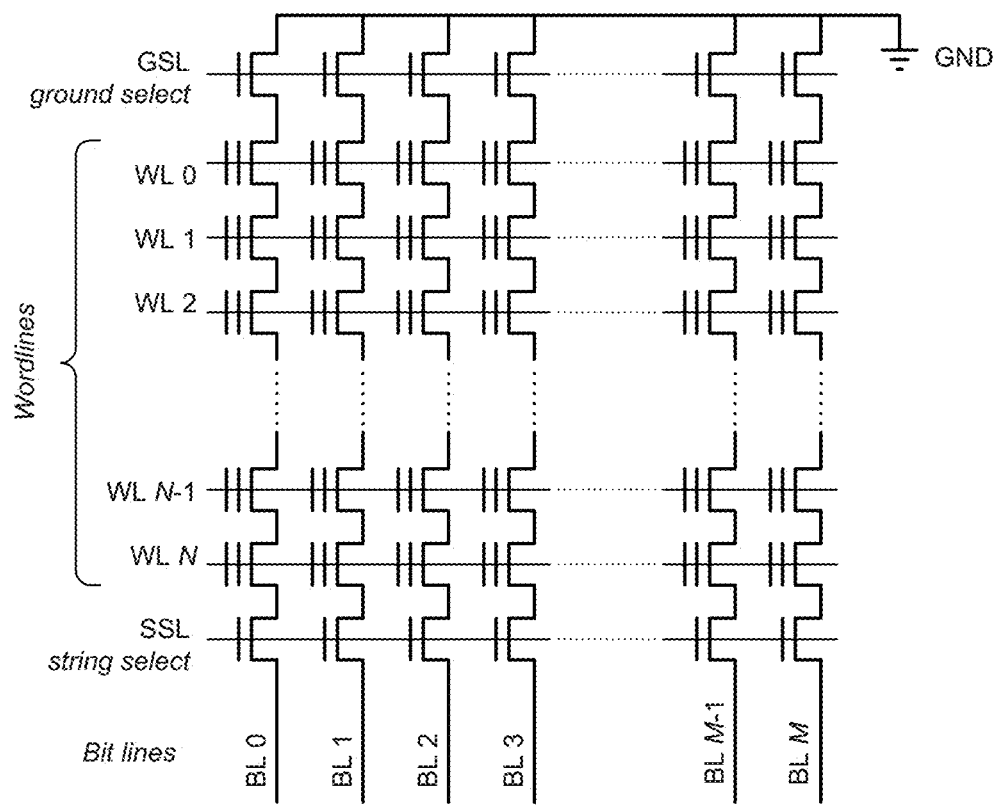
FIG. 2 is an illustration of an example non-volatile memory device.

FIG. 2 illustrates an example of a memory cell array implemented based on some embodiments of the disclosed technology.

In some implementations, the memory cell array can include NAND flash memory array that is partitioned into many blocks, and each block contains a certain number of pages. Each block includes a plurality of memory cell strings, and each memory cell string includes a plurality of memory cells.

In some implementations where the memory cell array is NAND flash memory array, read and write (program) operations are performed on a page basis, and erase operations are performed on a block basis. All the memory cells within the same block must be erased at the same time before performing a program operation on any page included in the block. In an implementation, NAND flash memories may use an even/odd bit-line structure. In another implementation, NAND flash memories may use an all-bit-line structure. In the even/odd bit-line structure, even and odd bit-lines are interleaved along each word-line and are alternatively accessed so that each pair of even and odd bit-lines can share peripheral circuits such as page buffers. In all-bit-line structure, all the bit-lines are accessed at the same time.

Figure 3:
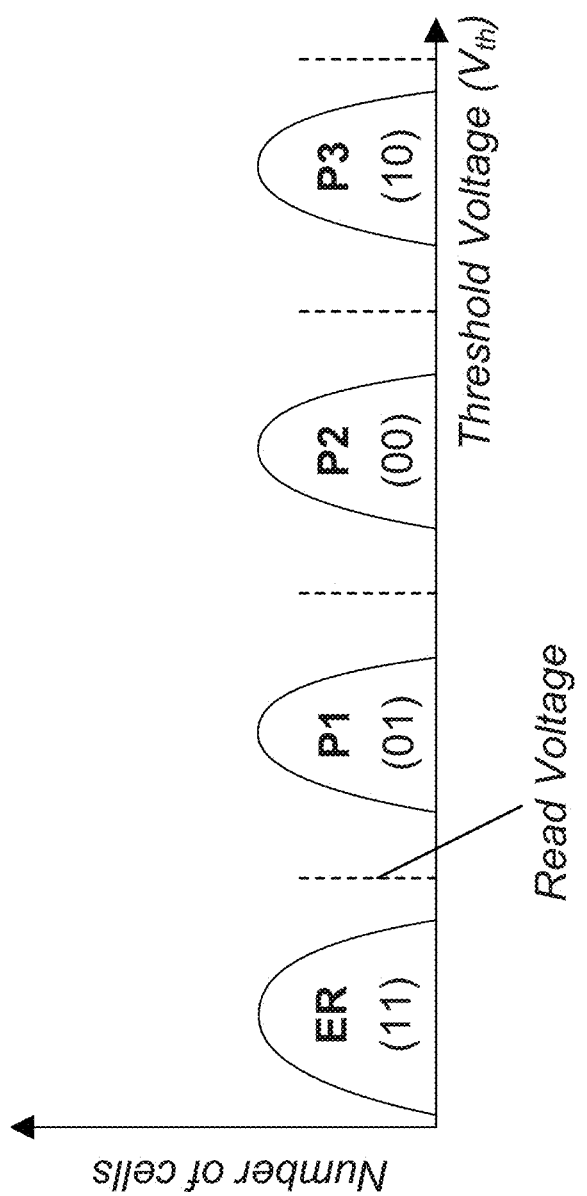
FIG. 3 is an example diagram illustrating the cell voltage level distribution ($V_{th}$) of a non-volatile memory device.

FIG. 3 illustrates an example of threshold voltage distribution curves in a multi-level cell device, wherein the number of cells for each program/erase state is plotted as a function of the threshold voltage. As illustrated therein, the threshold voltage distribution curves include the erase state (denoted "ER" and corresponding to "11") with the lowest threshold voltage, and three program states (denoted "P1", "P2" and "P3" corresponding to "01", "00" and "10", respectively) with read voltages in between the states (denoted by the dotted lines). In some embodiments, each of the threshold voltage distributions of program/erase states has a finite width because of differences in material properties across the memory array.

Although FIG. 3 shows a multi-level cell device by way of example, each of the memory cells can be configured to store any number of bits per cell. In some implementations, each of the memory cells can be configured as a single-level cell (SLC) to store one bit of information per cell, or as a triple-level cell (TLC) to store three bits of information per cell, or as a quad-level cells (QLC) to store four bits of information per cell.

In writing more than one data bit in a memory cell, fine placement of the threshold voltage levels of memory cells is needed because of the reduced distance between adjacent distributions. This is achieved by using incremental step pulse program (ISPP), i.e., memory cells on the same word-line are repeatedly programmed using a program-and-verify approach with a stair case program voltage applied to word-lines. Each programmed state associates with a verify voltage that is used in verify operations and sets the target position of each threshold voltage distribution window.

Read errors can be caused by distorted or overlapped threshold voltage distribution. An ideal memory cell threshold voltage distribution can be significantly distorted or overlapped due to, e.g., program and erase (P/E) cycle, cell-to-cell interference, and data retention errors, which will be discussed in the following, and such read errors may be managed in most situations by using error correction codes (ECC).

Figure 4:
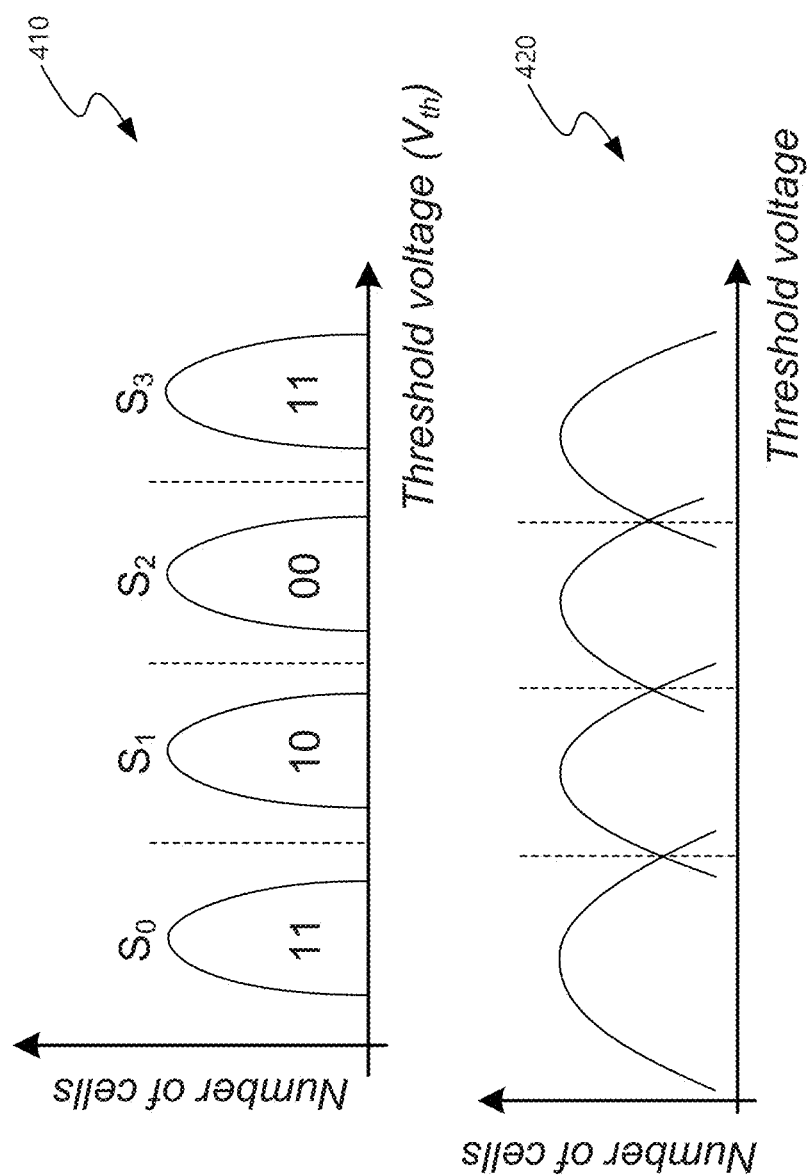
FIG. 4 is another example diagram illustrating the cell voltage level distribution ($V_{th}$) of a non-volatile memory device.

FIG. 4 illustrates an example of ideal threshold voltage distribution curves 410 and an example of distorted threshold voltage distribution curves 420. The vertical axis indicates the number of memory cells that has a particular threshold voltage represented on the horizontal axis.

For n-bit multi-level cell NAND flash memory, the threshold voltage of each cell can be programmed to $2^n$ possible values. In an ideal multi-level cell NAND flash memory, each value corresponds to a non-overlapping threshold voltage window.

Flash memory P/E cycling causes damage to a tunnel oxide of floating gate of a charge trapping layer of cell transistors, which results in threshold voltage shift and thus gradually degrades memory device noise margin. As P/E cycles increase, the margin between neighboring distributions of different programmed states decreases and eventually the distributions start overlapping. The data bit stored in a memory cell with a threshold voltage programmed in the overlapping range of the neighboring distributions may be misjudged as a value other than the original targeted value.

Figure 5:
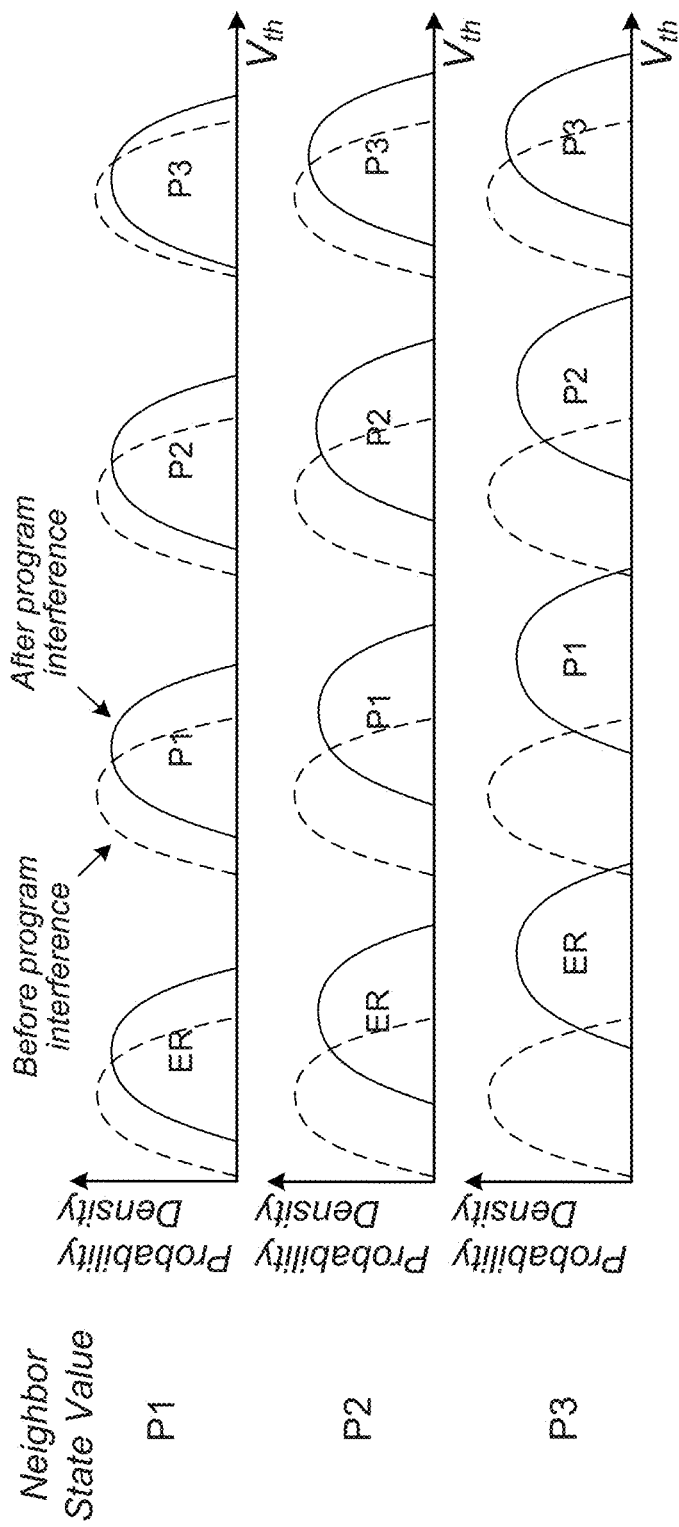
FIG. 5 is an example diagram illustrating the cell voltage level distribution ($V_{th}$) of a non-volatile memory device before and after program interference.

FIG. 5 illustrates an example of a cell-to-cell interference in NAND flash memory. The cell-to-cell interference can also cause threshold voltages of flash cells to be distorted. The threshold voltage shift of one memory cell transistor can influence the threshold voltage of its adjacent memory cell transistor through parasitic capacitance-coupling effect between the interfering cell and the victim cell. The amount of the cell-to-cell interference may be affected by NAND flash memory bit-line structure. In the even/odd bit-line structure, memory cells on one word-line are alternatively connected to even and odd bit-lines and even cells are programmed ahead of odd cells in the same word-line. Therefore, even cells and odd cells experience different amount of cell-to-cell interference. Cells in all-bit-line structure suffer less cell-to-cell interference than even cells in the even/odd bit-line structure, and the all-bit-line structure can effectively support high-speed current sensing to improve the memory read and verify speed.

The dotted lines in FIG. 5 denote the nominal distributions of P/E states (before program interference) of the cells under consideration, and the "neighbor state value" denotes the value that the neighboring state has been programmed to. As illustrated in FIG. 5, if the neighboring state is programmed to P1, the threshold voltage distributions of the cells under consideration shift by a specific amount. However, if the neighboring state is programmed to P2, which has a higher threshold voltage than P1, that results in a greater shift compared to the neighboring state being P1. Similarly, the shift in the threshold voltage distributions is greatest when the neighboring state is programmed to P3.

Figure 6:
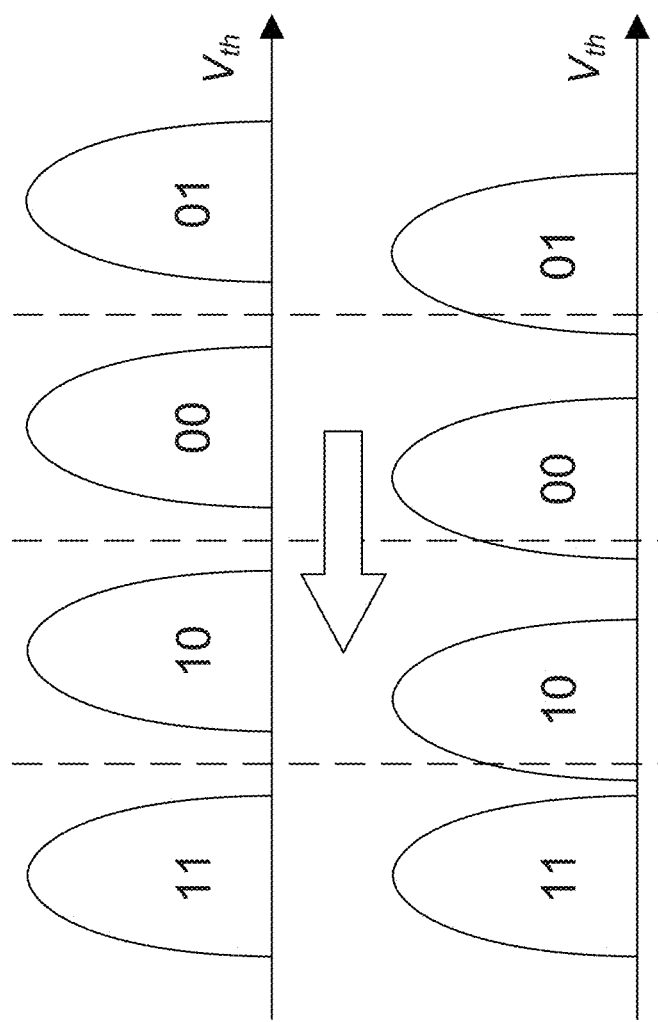
FIG. 6 is an example diagram illustrating the cell voltage level distribution ($V_{th}$) of a non-volatile memory device as a function of the reference voltage.

FIG. 6 illustrates an example of a retention error in NAND flash memory by comparing normal threshold-voltage distribution and shifted threshold-voltage distribution. The data stored in NAND flash memories tend to get corrupted over time and this is known as a data retention error. Retention errors are caused by loss of charge stored in the floating gate or charge trap layer of the cell transistor. Due to wear of the floating gate or charge trap layer, memory cells with more program erase cycles are more likely to experience retention errors. In the example of FIG. 6, comparing the top row of voltage distributions (before corruption) and the bottom row of distributions (contaminated by retention error) reveals a shift to the left.

NAND flash memory devices (e.g., as described in FIGS. 1-6) are susceptible to the large latencies of the erase and programming operations, and to this end, an SSD may employ volatile DRAM for caching writes and send write-command completions to the host as soon as data is stored in the DRAM cache. This reduces the host-write latency for most writes to that of DRAM write-latency (typically, a few microseconds). However, when the DRAM cache is full, host-write commands cannot be completed until some data is moved from DRAM cache to a NAND page. These write commands experience latency equal to the latency of NAND programming operation (typically, hundreds of microseconds). In the worst case, no NAND pages are available and the SSD must perform one cycle of garbage collection before more host-writes can be served. This leads to a host-write command latency equal to the latency of erase-operations (typically, a few milliseconds).

This problem may be exacerbated when the host-workload has a large burst of write-commands. From the host's perspective, it is desirable to use SSDs with consistent write-command latency, especially for enterprise applications where writes are spread across multiple drives in a RAID scheme and a long latency on any one drive may cause application lags.

Previous techniques that have addressed this issue by adding a constant delay to all write-command completions to spread the maximum latency to all commands. However, this approach causes unnecessary latency when the write-traffic percentage is small or when the write-cache is empty.

According to some embodiments of the disclosed technology, the SSD controller hardware (e.g., the firmware) may measure the latency of each host-write command at the host interface and delay the write-command completion if the measured latency is lower than a particular threshold. This particular threshold, which represents the minimum duration after which a write-command completion message is output, is stored as the MinDuration register setting. Using a minimum duration ensures that the latency for write-commands can be controlled to be within a predetermined amount (e.g., some small variance around a mean value) to maintain a consistent write-command latency. On the other hand, if the latency exceeds the MinDuration threshold, the hardware updates one or more counters that are configured to track latency violations. In some embodiments, the firmware adapts the MinDuration value based on the value of the one or more counters after a timer expires or a flash translation layer (FTL) event is encountered. It should be noted that in the description that follows, certain register names and parameters are used by the way of example, and not by limitation, to facilitate understanding of the disclosed technology.

In some embodiments, the SSD controller achieves improved write-QoS (quality of service) by adding an appropriate delay to command completion when the host-write is finished by placing data in the DRAM cache. To determine which commands need added delays, the SSD controller has dedicated hardware that maintains a timer and keeps track of the arrival time of each write-command while it is pending. In these instances, delay is added to the write-command completion command to achieve a latency equal to the current value of MinDuration.

In some embodiments, MinDuration can be configured to a pre-determined value such that the rate of sending write-completion matches the rate at which data is moved from the cache to the NAND pages in a sustained write scenario.

However, this may cause unnecessary write performance degradation, and thus, an adaptive scheme applies the appropriate delays to write-completions only when necessary. In these embodiments, the SSD controller hardware maintains the following counters in addition to the timer and latency-measurement blocks:

1) TotalWritesCount: This register maintains a count of the total number of host-writes completed since last reset.

2) X1Count: This register maintains a count of the number of host-writes where the host-write latency exceeded MinDuration by 5 microseconds.

3) X2Count: This register maintains a count of the number of host-writes where the latency exceeded 2×MinDuration.

The firmware running on the SSD controller reads the three counters periodically and updates MinDuration and the following registers:

1) AdaptiveState: The current state of the scheme which represents the time or commands since last write-latency violation. AdaptiveState equal to 0 represents a recent latency violation (or equivalently, the occurrence of a latency violation in a predetermined duration before the current time) and AdaptiveState equal to 7 represents steady-state having been achieved by the adaptive scheme.

2) LastSteadyStateMinDuration: The value of MinDuration when steady-state was last achieved.

Figure 7A:
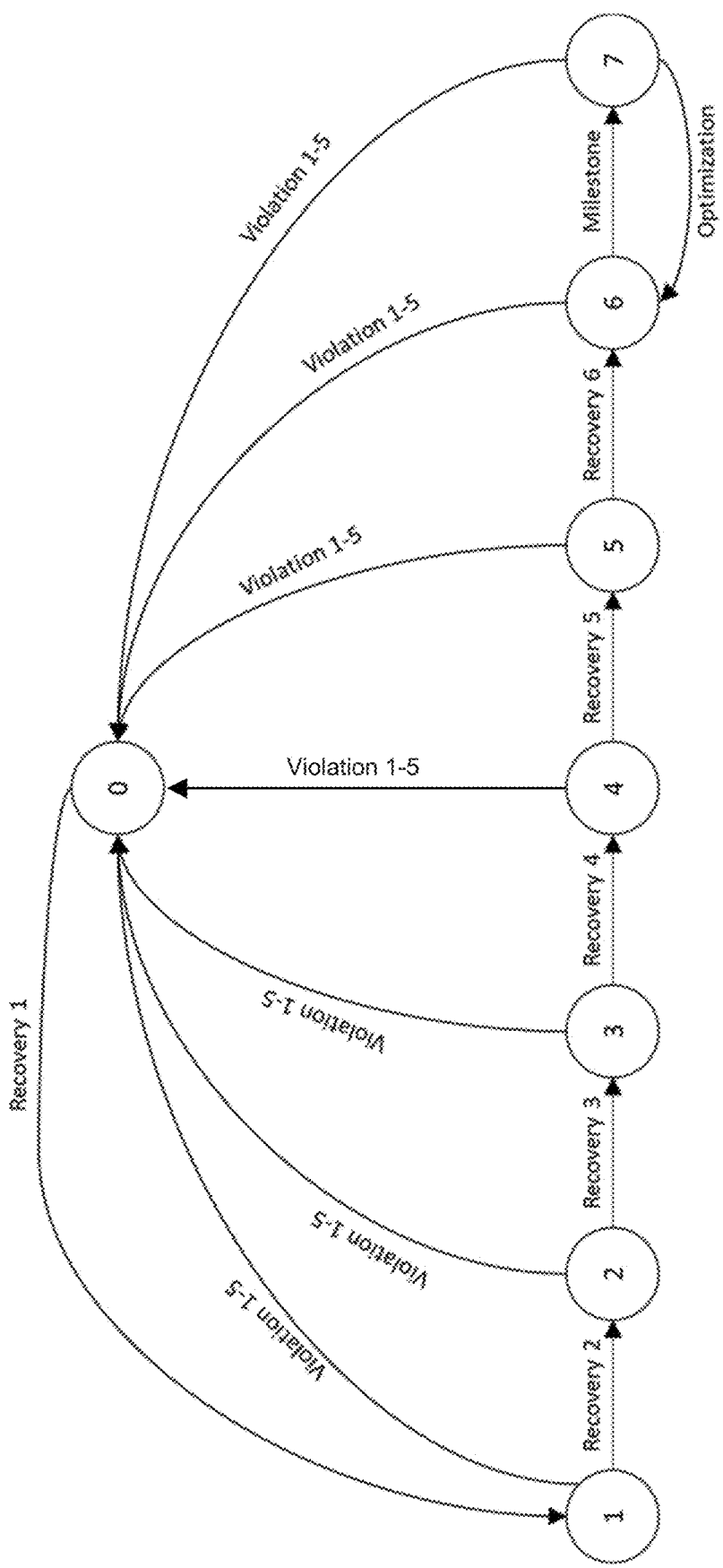
FIG. 7A illustrates an example finite state machine (FSM) that can be used to adaptively determine the minimum duration.

In some embodiments, the firmware uses a finite state machine (FSM) to determine the new values for MinDuration, AdaptiveState and LastSteadyStateMinDuration, as illustrated in FIG. 7A. FIG. 7B is a table that includes the various example thresholds, branches and reset conditions for the FSM illustrated in FIG. 7A.

In the example illustrated in FIGS. 7A and 7B, the minDuration register setting is configured to increase quickly (e.g., latency violation 1 is triggered when the TotalWriteCount is greater than or equal to 16) due to the bursty nature of write violations, but is scaled back on a slower scale. Herein, the thresholds and reset conditions are a function of the workload.

Figure 8:
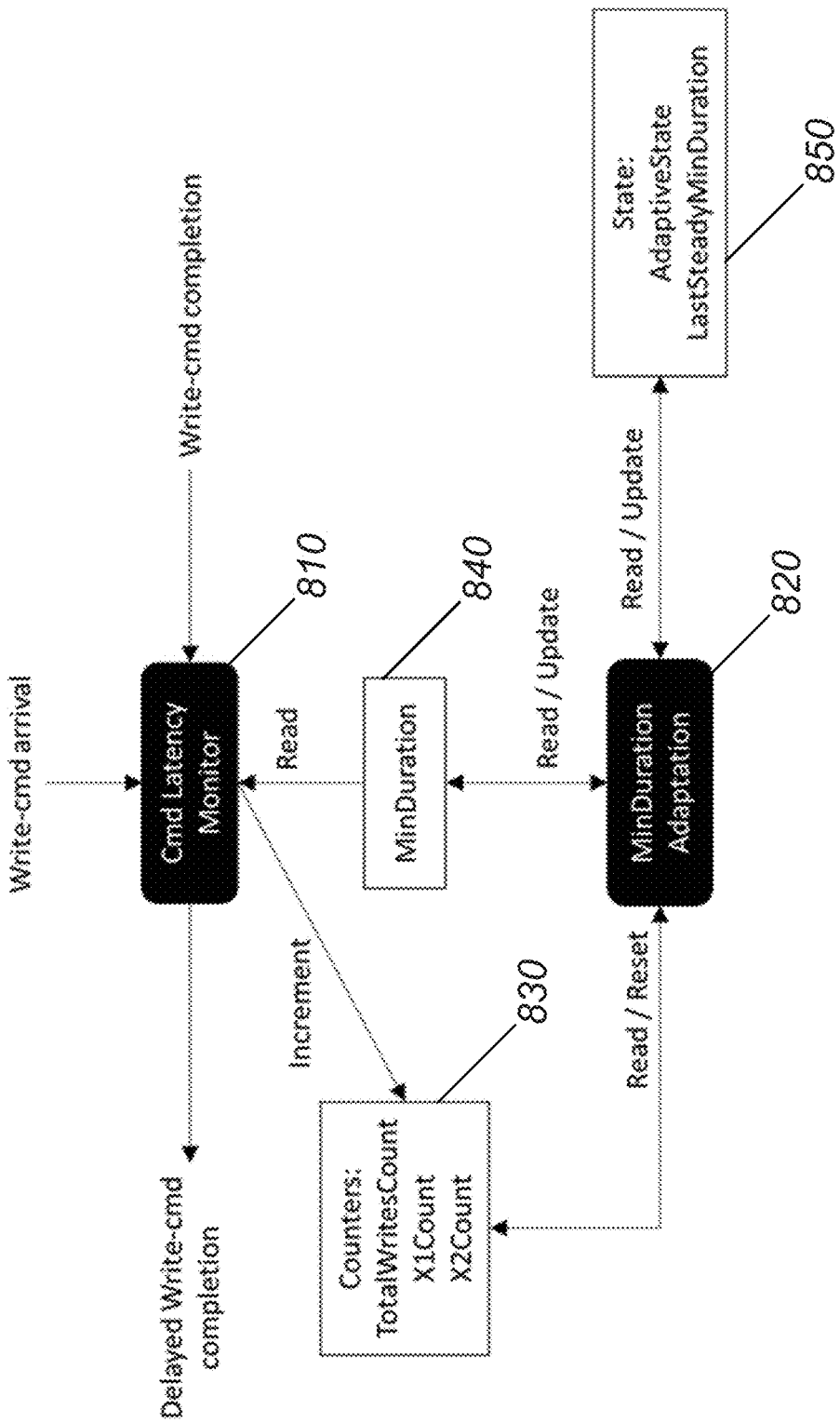
FIG. 8 illustrates a flowchart of an example method for adaptively determining delays in a non-volatile memory device.

FIG. 8 illustrates a flowchart of the overall scheme for adaptively determining delays in a non-volatile memory device, according to various embodiments of the disclosed technology. As illustrated therein, the command latency monitor 810 receives the arrival of the write command (e.g., the command itself or a corresponding timestamp), the completion of the write command, and computes and outputs a delayed completion of the write command based on the value in the MinDuration register 840.

The MinDuration register 840 is read and updated by the MinDuration adaptation module 820, which also bi-directionally communicates with the counters 830 (e.g., the three counters in the example illustrated in FIG. 8) and the state registers 850 (e.g., which include AdaptiveState and LastSteadyStateMinDuration).

Figure 9A:
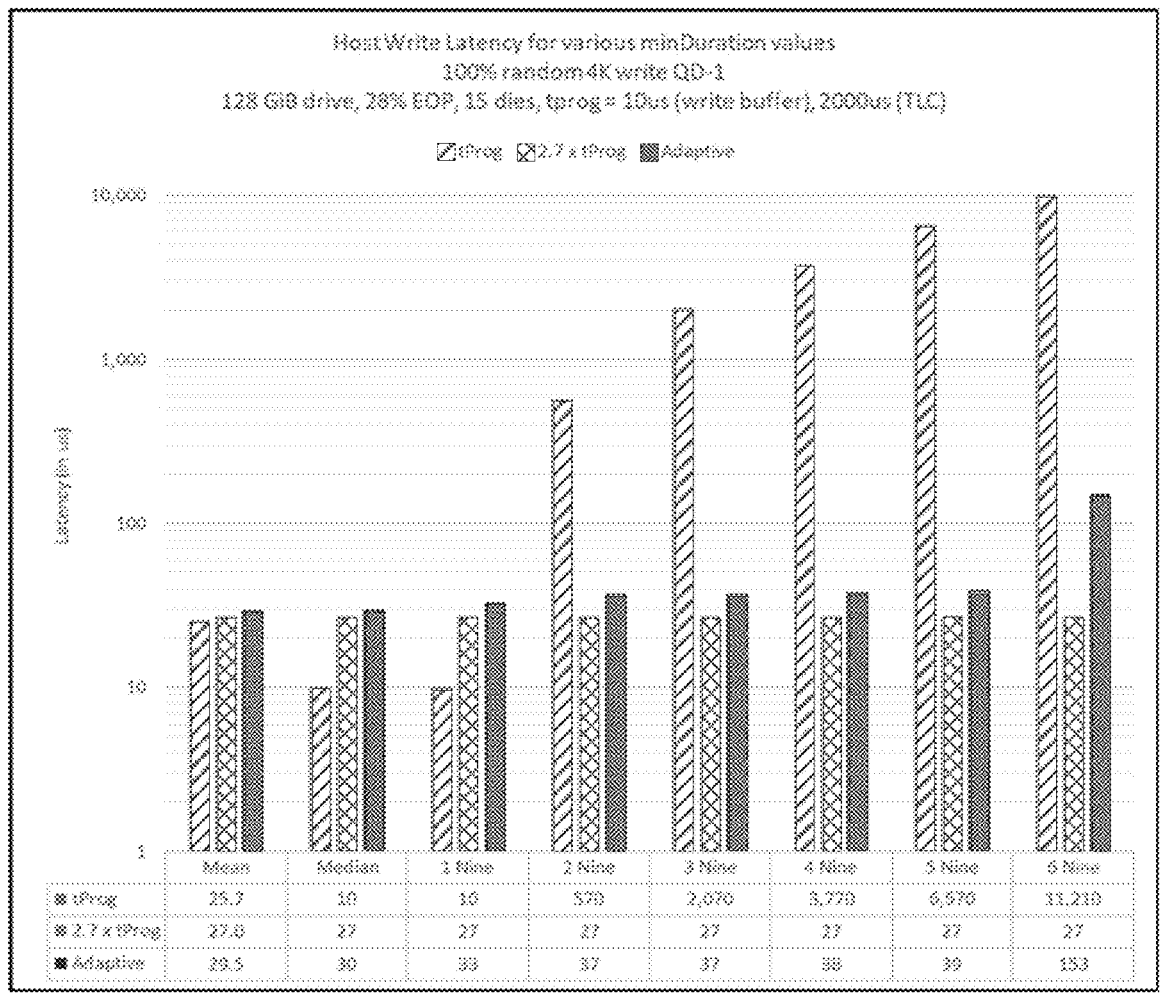
FIG. 9A is an example numerical comparison of write-latency distributions.
Figure 9B:
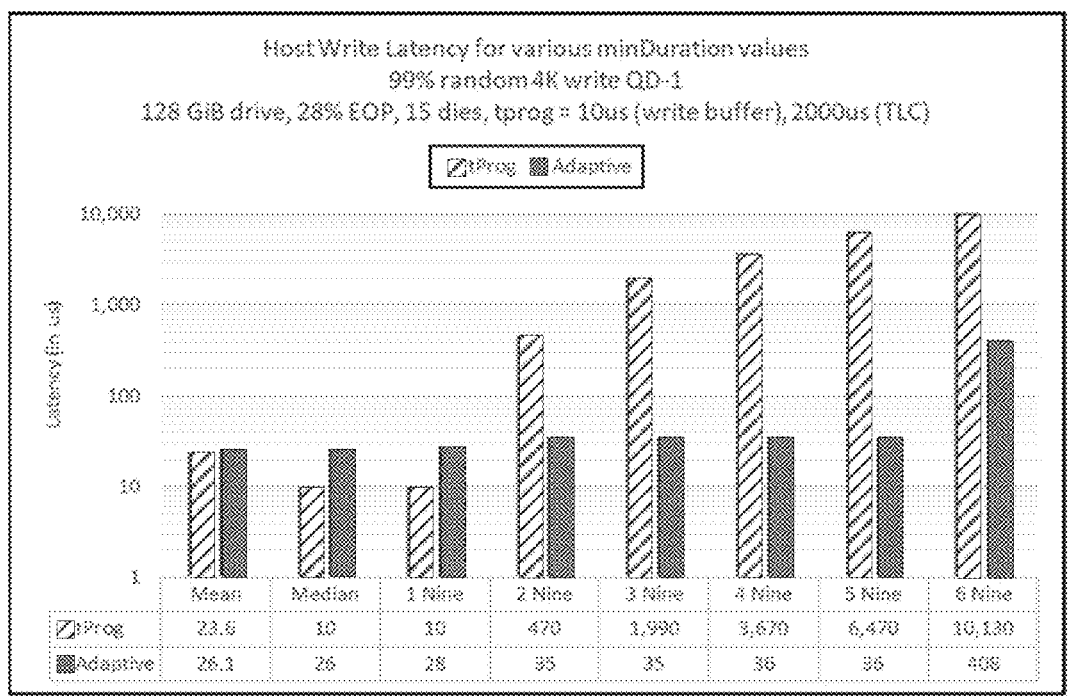
FIG. 9B is another example numerical comparison of write-latency distributions.
Figure 9C:
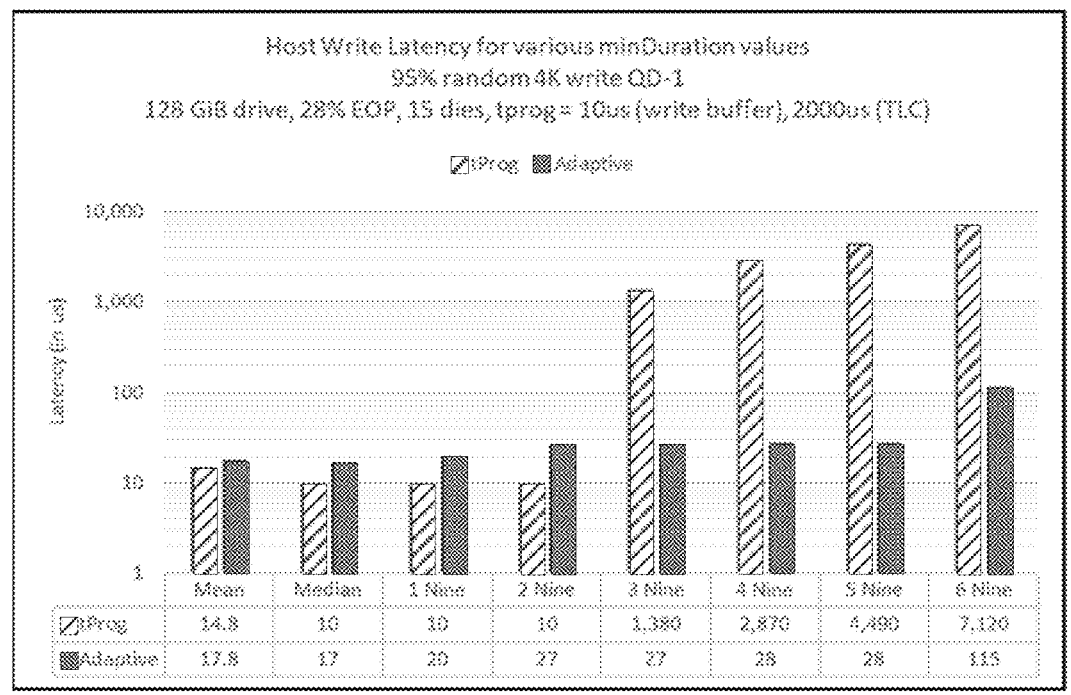
FIG. 9C is yet another example numerical comparison of write-latency distributions.

FIGS. 9A, 9B and 9C illustrate the improvement in the tail of the distribution of latency of host-write commands when embodiments of the disclosed technology are used for various traffic models. The tail of the distribution of latency of host-write commands refers to the latency values that are farther away from the mean, i.e., either very low latency values (e.g., when the write-cache is empty) or very high latency values (e.g., when no NAND pages are available and a garbage collection cycle must be performed). Thus, the described embodiments reduce the occurrence of these tail events, thereby ensuring that the latency of host-write commands are tightly clustered around the mean value.

FIG. 9A illustrates the host-write latency for various minDuration values for the case with 100% workload on a drive with a queue depth of 1 (QD=1), which corresponds to a single thread running, comprising write commands with each write command specifying 4 Kilobytes (4K) of random data. In this example, the drive under consideration is a 128 GB drive with 15 dies, 2000 µs triple level cells (TLC), 28% effective over-provisioning (EOP) and a nominal value for the write completion message with no delay (denoted tProg) set to 10 µs. "2.7×tProg" refers to a fixed latency scenario set to an ideal value (for the simulation parameters), and "Adaptive" refers to an adaptive delay scheme as described by embodiments of the disclosed technology.

As illustrated in FIG. 9A, the latency for the adaptive scheme is relatively constant up to the "5 Nine" level, which indicates that the adaptive scheme reduces the tail of the host-write latencies up to 99.9999 percentile. The latency for the "tProg" scenario, in which no delay is incurred before outputting the write-completion command, increases dramatically as the tail constraint increases (i.e., increasing number of "Nine(s)").

FIGS. 9B and 9C compare the "tProg" and "Adaptive" schemes for a 99% and 95% write workload for the same drive as used in FIG. 9A, respectively. As illustrated therein, the adaptive scheme is only marginally worse than the "tProg" case in the 95% workload case.

Embodiments of the disclosed technology may be applicable in cases where a single-level cell (SLC) NAND cache is used instead of (or in combination with) the DRAM cache. These scenarios depend on the measured latency rather than the number of free pages in the write-buffers, and thus the described embodiments also work when the write-buffers are adaptively repurposed for other tasks in the SSD.

Figure 10:
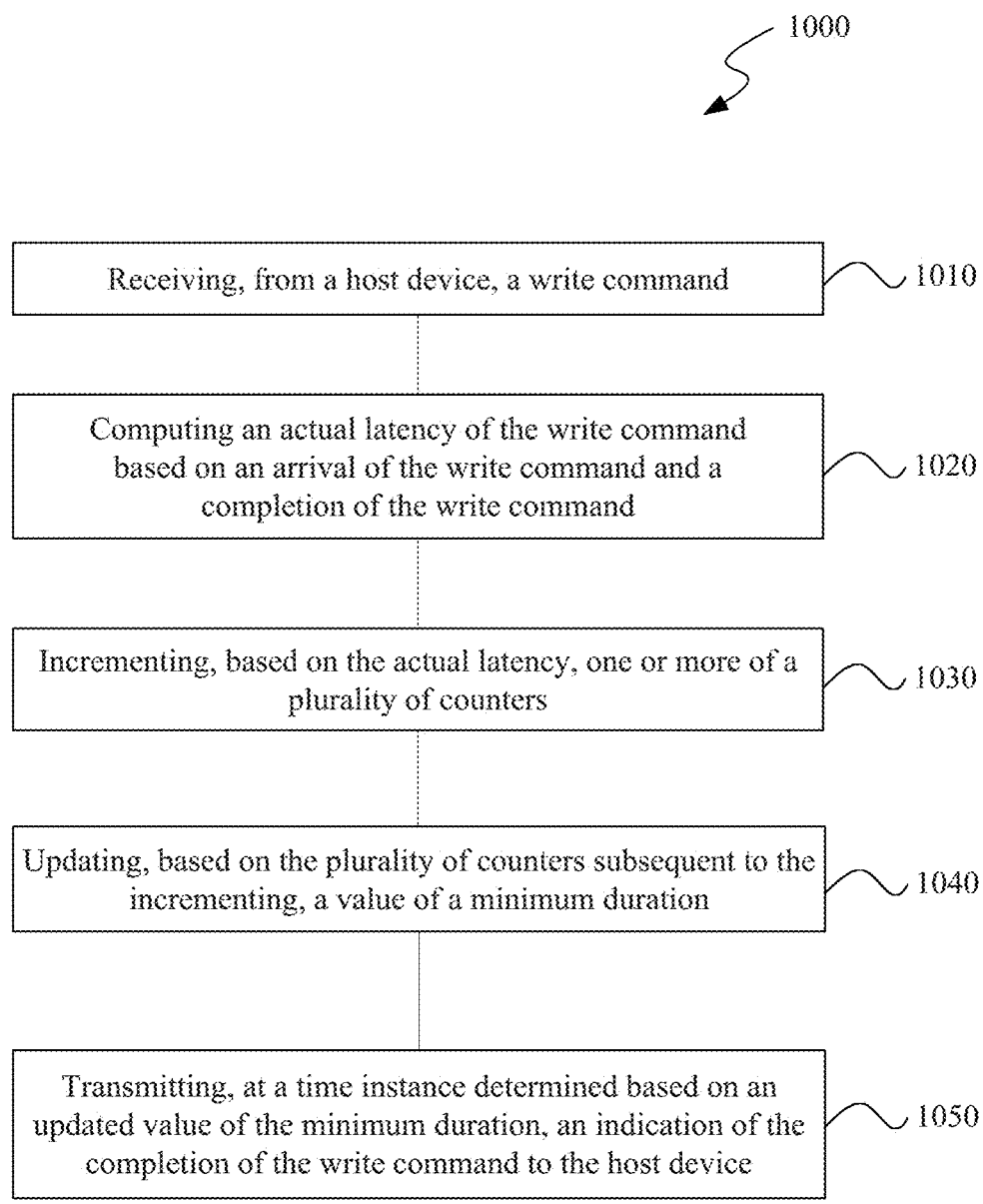
FIG. 10 illustrates a flowchart of an example method for maintaining consistent write latencies in non-volatile memory devices.

FIG. 10 illustrates a flowchart of a method for maintaining consistent write latencies in non-volatile memory devices. The method 1000 includes, at operation 1010, receiving, from a host device, a write command.

The method 1000 includes, at operation 1020, computing an actual latency of the write command based on an arrival of the write command and a completion of the write command.

The method 1000 includes, at operation 1030, incrementing, based on the actual latency, one or more of a plurality of counters.

The method 1000 includes, at operation 1040, updating, based on the plurality of counters subsequent to the incrementing, a value of a minimum duration.

The method 1000 includes, at operation 1050, transmitting, at a time instance determined based on an updated value of the minimum duration, an indication of the completion of the write command to the host device.

In some embodiments, the minimum duration represents a minimum latency between the arrival of the write command and the transmitting of the indication to the host device, transmitting at the time instance enables an observed latency to remain within a predetermined tolerance of an average value of the actual latency, the observed latency is determined based on a difference in time between the arrival of the write command and the transmitting, a first counter of the plurality of counters indicates a total number of write commands, and is incremented upon a reception of the write command, and each of a second and subsequent counter corresponds to a type of latency violation, and is incremented upon a determination that the latency exceeds a corresponding threshold of a plurality of thresholds.

In some embodiments, updating the value of the minimum duration is further based on a steady-state value of the minimum duration.

In some embodiments, updating the value of the minimum duration is further based on an occurrence of a flash translation layer (FTL) event.

In some embodiments, the non-volatile memory device is a NAND flash device.

In some embodiments, the plurality of counters comprises three counters, a first threshold of the plurality of thresholds is between 110% to 125% of the value of the minimum duration, and the second threshold of the plurality of thresholds is twice the value of the minimum duration.

In some embodiments, the plurality of counters comprises three counters, a first threshold of the plurality of thresholds exceeds the value of the minimum duration by 5 microseconds, and the second threshold of the plurality of thresholds is twice the value of the minimum duration.

In some embodiments, an initial value of the minimum duration is predetermined.

In some embodiments, the method 1000 further includes the step of updating, based on the plurality of counters, a first register that stores a state of the method that corresponds to a duration or a number of commands since a most recent latency violation, wherein the state is an integer ranging from 0 to N, wherein a state 0 corresponds to the most recent latency violation having occurred within a predetermined amount of time, and wherein a state N corresponds to the method operating in a steady-state.

In some embodiments, the method 1000 further includes the step of updating, based on the plurality of counters, a second register that stores the value of the minimum duration corresponding to a most recent time that the method was operating in a steady-state.

Implementations of the subject matter and the functional operations described in this patent document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing unit" or "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., EPROM, EEPROM, and flash memory devices. The processor and the memory can be supplemented by, or incorporated in, special purpose logic circuitry.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A method of maintaining a consistent write latency in a non-volatile memory device, comprising:

receiving, from a host device, a write command;
computing an actual latency of the write command based on an arrival of the write command and a completion of the write command;
incrementing, based on the actual latency, one or more of a plurality of counters;
updating, based on the plurality of counters subsequent to the incrementing, a value of a minimum duration; and
transmitting, at a time instance determined based on an updated value of the minimum duration, an indication of the completion of the write command to the host device,
wherein the minimum duration represents a minimum latency between the arrival of the write command and the transmitting of the indication to the host device,
wherein transmitting at the time instance enables an observed latency to remain within a predetermined tolerance of an average value of the actual latency,
wherein the observed latency is determined based on a difference in time between the arrival of the write command and the transmitting,
wherein a first counter of the plurality of counters indicates a total number of write commands, and is incremented upon a reception of the write command, and
wherein each of a second and subsequent counter corresponds to a type of latency violation, and is incremented upon a determination that the latency exceeds a corresponding threshold of a plurality of thresholds.

2. The method of claim 1, wherein updating the value of the minimum duration is further based on a steady-state value of the minimum duration.

3. The method of claim 1, wherein updating the value of the minimum duration is further based on an occurrence of a flash translation layer (FTL) event.

4. The method of claim 1, wherein the non-volatile memory device is a NAND flash device.

5. The method of claim 1, wherein the plurality of counters comprises three counters, wherein a first threshold of the plurality of thresholds is between 110% to 125% of the value of the minimum duration, and wherein the second threshold of the plurality of thresholds is twice the value of the minimum duration.

6. The method of claim 1, wherein the plurality of counters comprises three counters, wherein a first threshold of the plurality of thresholds exceeds the value of the minimum duration by 5 microseconds, and wherein the second threshold of the plurality of thresholds is twice the value of the minimum duration.

7. The method of claim 1, wherein an initial value of the minimum duration is predetermined.

8. The method of claim 1, further comprising:
updating, based on the plurality of counters, a first register that stores a state of the method that corresponds to a duration or a number of commands since a most recent latency violation, wherein the state is an integer ranging from 0 to N, wherein a state 0 corresponds to the most recent latency violation having occurred within a predetermined amount of time, and wherein a state N corresponds to the method operating in a steady-state.

9. The method of claim 8, further comprising:
updating, based on the plurality of counters, a second register that stores the value of the minimum duration corresponding to a most recent time that the method was operating in a steady-state.

10. A system for maintaining a consistent write latency in a non-volatile memory device, comprising:

a processor and a memory including instructions stored thereupon, wherein the instructions upon execution by the processor cause the processor to:
receive, from a host device, a write command;
compute an actual latency of the write command based on an arrival of the write command and a completion of the write command;
increment, based on the actual latency, one or more of a plurality of counters;
update, based on the plurality of counters subsequent to the incrementing, a value of a minimum duration; and
transmit, at a time instance determined based on an updated value of the minimum duration, an indication of the completion of the write command to the host device,
wherein the minimum duration represents a minimum latency between the arrival of the write command and the transmitting of the indication to the host device,
wherein transmitting at the time instance enables an observed latency to remain within a predetermined tolerance of an average value of the actual latency,
wherein the observed latency is determined based on a difference in time between the arrival of the write command and the transmitting,
wherein a first counter of the plurality of counters indicates a total number of write commands, and is incremented upon a reception of the write command, and
wherein each of a second and subsequent counter corresponds to a type of latency violation, and is incremented upon a determination that the latency exceeds a corresponding threshold of a plurality of thresholds.

11. The system of claim 10, wherein updating the value of the minimum duration is further based on a steady-state value of the minimum duration.

12. The system of claim 10, wherein updating the value of the minimum duration is further based on an occurrence of a flash translation layer (FTL) event.

13. The system of claim 10, wherein the plurality of counters comprises three counters, wherein a first threshold of the plurality of thresholds is between 110% to 125% of the value of the minimum duration, and wherein the second threshold of the plurality of thresholds is twice the value of the minimum duration.

14. The system of claim 10, wherein the processor is further configured to:
update, based on the plurality of counters, a first register that stores a state of the method that corresponds to a duration or a number of commands since a most recent latency violation, wherein the state is an integer ranging from 0 to N, wherein a state 0 corresponds to the most recent latency violation having occurred within a predetermined amount of time, and wherein a state N corresponds to the method operating in a steady-state.

15. The system of claim 14, wherein the processor is further configured to:
update, based on the plurality of counters, a second register that stores the value of the minimum duration corresponding to a most recent time that the method was operating in a steady-state.

16. A non-transitory computer-readable storage medium having instructions stored thereupon for maintaining a consistent write latency in a non-volatile memory device, comprising:

instructions for receiving, from a host device, a write command;

instructions for computing an actual latency of the write command based on an arrival of the write command and a completion of the write command;

instructions for incrementing, based on the actual latency, one or more of a plurality of counters;

instructions for updating, based on the plurality of counters subsequent to the incrementing, a value of a minimum duration; and instructions for transmitting, at a time instance determined based on an updated value of the minimum duration, an indication of the completion of the write command to the host device, wherein the minimum duration represents a minimum latency between the arrival of the write command and the transmitting of the indication to the host device, wherein transmitting at the time instance enables an observed latency to remain within a predetermined tolerance of an average value of the actual latency, wherein the observed latency is determined based on a difference in time between the arrival of the write command and the transmitting, wherein a first counter of the plurality of counters indicates a total number of write commands, and is incremented upon a reception of the write command, and wherein each of a second and subsequent counter corresponds to a type of latency violation, and is incremented upon a determination that the latency exceeds a corresponding threshold of a plurality of thresholds.

17. The storage medium of claim 16, wherein the instructions for updating the value of the minimum duration is further based on a steady-state value of the minimum duration.

18. The storage medium of claim 16, wherein the instructions for updating the value of the minimum duration is further based on an occurrence of a flash translation layer (FTL) event.

19. The storage medium of claim 16, wherein the non-volatile memory device is a NAND flash device.

20. The storage medium of claim 16, wherein the plurality of counters comprises three counters, wherein a first threshold of the plurality of thresholds is between 110% to 125% of the value of the minimum duration, and wherein the second threshold of the plurality of thresholds is twice the value of the minimum duration.

* * * * *